United States Patent
Guidash et al.

(10) Patent No.: US 6,466,266 B1
(45) Date of Patent: Oct. 15, 2002

(54) ACTIVE PIXEL SENSOR WITH SHARED ROW TIMING SIGNALS

(75) Inventors: Robert M. Guidash, Rush; Antonio S. Ciccarelli, Rochester, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/124,206

(22) Filed: Jul. 28, 1998

(51) Int. Cl.$^7$ ................................................ H04N 5/335
(52) U.S. Cl. ...................................... 348/308; 348/302
(58) Field of Search ................................. 308/294, 302, 308/308; 250/208.01; 257/249, 250; H04N 5/335

(56) References Cited

U.S. PATENT DOCUMENTS

| | | |
|---|---|---|
| 5,471,515 A | 11/1995 | Fossum et al. |
| 5,539,461 A | 7/1996 | Andoh et al. ................ 348/308 |
| 5,625,210 A | 4/1997 | Lee et al. |

FOREIGN PATENT DOCUMENTS

| | | | |
|---|---|---|---|
| EP | 0 809 394 A2 | 11/1997 | ............ H04N/3/15 |
| WO | WO 96/03773 | 2/1996 | ......... H01L/27/146 |

OTHER PUBLICATIONS

"An 800K–Pixel Color CMOS Sensor For Consumer Still Cameras" by J.E.D. Hurwitz, Peter B. Denyer, Donald J. Baxter, Graham Townsend. VLSI Vision Ltd., Edinburgh.

"A 250,000–Pixel Image Sensor with FET Amplification at Each Pixel for High–Speed Television Cameras" by Fumihiko Andoh, Kazuhisa Taketoshi, Junichi Yamazaki, Masayuki Sugawara, Toshihior Fujita, Kohji Mitani. IEEE International Solid–State Circuits Conference, 1990.

"A Small Pixel CMD Image Sensor" by Masanori Ogata, Tsutomu Nakamura, Kazuya Matsumoto, Ryo Ohta, and Ryouji Hyuga. IEEE Transactions on Electron Devices, vol. 38, No. 5, May 1991.

"128×128 CMOS Photodiode–Type Active Pixel Sensor with On–Chip Timing, Control and Signal Chain Electronics" by R.H. Nixon, S.E. Kemeny, C.O. Staller, and E.R. Fossum. Proceedings of the SPIE vol. 2415, Change–Coupled Devices and Solid–State Optical Sensors V, paper 34 (1995).

"A ¼ Inch 330k Square Pixel Progressive Scan CMOS Active Pixel Image Sensor" by Eiji Oba, Keiji Mabuchi, Yoshinori Iida, Nobuo Nakamura, Hiroki Miura. 1997 IEEE International Solid–State Circuits Conference.

"Active Pixel Sensors: Are CCD's Dinosaurs?" by Eric R. Fossum. Jet Propulsion Laboratory, California Institute of Technology. SPIE vol. 1900.

*Primary Examiner*—Tuan Ho
(74) *Attorney, Agent, or Firm*—Peyton C. Watkins

(57) ABSTRACT

An Active Pixel Sensor with increased sensitivity by employing an improved buss structure reducing the number of signal lines used within the sensor and approaching the sensitivity of a CCD device while still retaining the advantages of an APS device. Fill factor and sensitivity of an APS device is increased by sharing signal busses between rows that are currently being read out and those that are to be read out next. This eliminates the need for a separate signal line contact area in each pixel, and uses the timing signal and buss for one row as another timing signal and buss for the next row.

18 Claims, 8 Drawing Sheets

ACTIVE PIXEL SENSOR WITH SHARED ROW TIMING SIGNALS

FIELD OF THE INVENTION

The invention relates generally to the field of solid state photo-sensors and imagers, specifically imagers referred to as Active Pixel Sensors (APS).

BACKGROUND OF THE INVENTION

Active Pixel Sensors (APS) are solid state imagers wherein each pixel contains a photo-sensing means, reset means, a charge transfer means, a charge to voltage conversion means, and all or part of an amplifier. APS devices have been operated in a manner where each line or row of the imager is selected and then read out using a column select signal (analogous to a word and bit line in memory devices respectively). In prior art devices the connection or contact to the various nodes within the pixels of a given row are done on a per pixel basis, even tough they are the same electrical node within a row (see FIG. 1). Since contact regions are placed in each pixel, and contact regions typically consume large amounts of pixel area due to the overlap of metal layers required, inclusion of these contact regions in each pixel reduces the fill factor for the pixel because it takes up area that could otherwise be used for the photodetector. Connection to each of these components to the appropriate timing signal is done by metal busses that traverse the entire row of pixels. These metal busses are optically opaque and can occlude regions of the photodetector in order to fit them into the pixel pitch. This also reduces the fill factor of the pixel. Decreasing the fill factor reduces the sensitivity and saturation signal of the sensor. This adversely affects the photographic speed and dynamic range of the sensor, performance measures that are critical to obtaining good image quality.

In order to build high resolution, small pixel APS devices, it is necessary to use sub-$\mu$m CMOS processes in order to minimize the area of the pixel allocated tot he non-photodetector components in the pixel. In essence, it takes a more technologically advanced and more costly process to realize the same resolution and sensitivity APS device when compared to a standard charge coupled device (CCD) sensor. However, APS devices have the advantages of single supply operation, lower power consumption, x-y addressability, image widowing and the ability to effectively integrate signal processing electronics on-chip, when compared to CCD sensors.

From the above discussion it should be apparent that there remains a need within the art for an improved method of employing signal buss structures within APS devices.

SUMMARY OF THE INVENTION

The present invention is directed to overcoming one or more of the problems set forth above. Briefly summarized, according to one aspect of the present invention, an active pixel sensor comprising: a CMOS substrate having a plurality of pixels formed in a plurality of rows and columns; wherein each of the pixels further comprises a photodetector having active circuitry elements associated with the photodetector; at least two control busses associated with each row of pixels; and wherein one of the control busses for a given row functions one of the control busses for a different row.

One approach to providing an image sensor with the sensitivity of a CCD and the advantages of an APS device, is to improve the fill factor and sensitivity of an APS device. This invention does so by eliminating the need for a separate signal line contact area in each pixel, and using the timing signal and buss for one row as a timing signal and buss for the next row.

These and other aspects, objects, features, and advantages of the present invention will be more clearly understood and appreciated from a review of the following detailed description of the preferred embodiments and appended claims, and by reference to the accompanying drawings.

Advantageous Effect of the Invention

All of the features and advantages of prior art APS devices are maintained while requiring less pixel area for contact regions and metal busses. This provides the following advantages: Higher fill factor, sensitivity and saturation signal for the same pixel size, smaller pixel and device size for the same fill factor.

BRIEF DESCRIPTION OF THE DRAWINGS

FIG. 1b is a top view illustrating a typical layout of the prior art pixel design of FIG. 1a;

To facilitate understanding, identical reference numerals have been used, where possible, to designate identical elements that are common to the figures.

DETAILED DESCRIPTION OF THE INVENTION

Figure 1A:
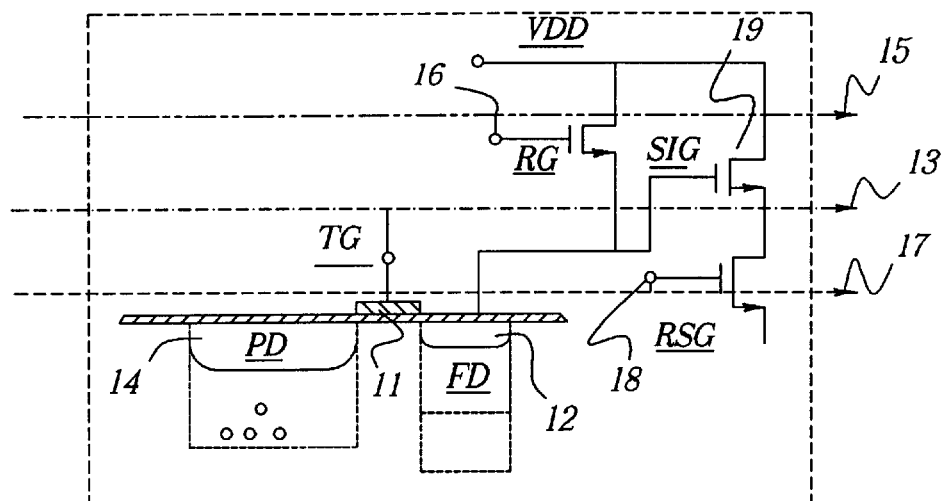
FIG. 1a is a schematic drawing of a prior art pixel design.
Figure 1B:
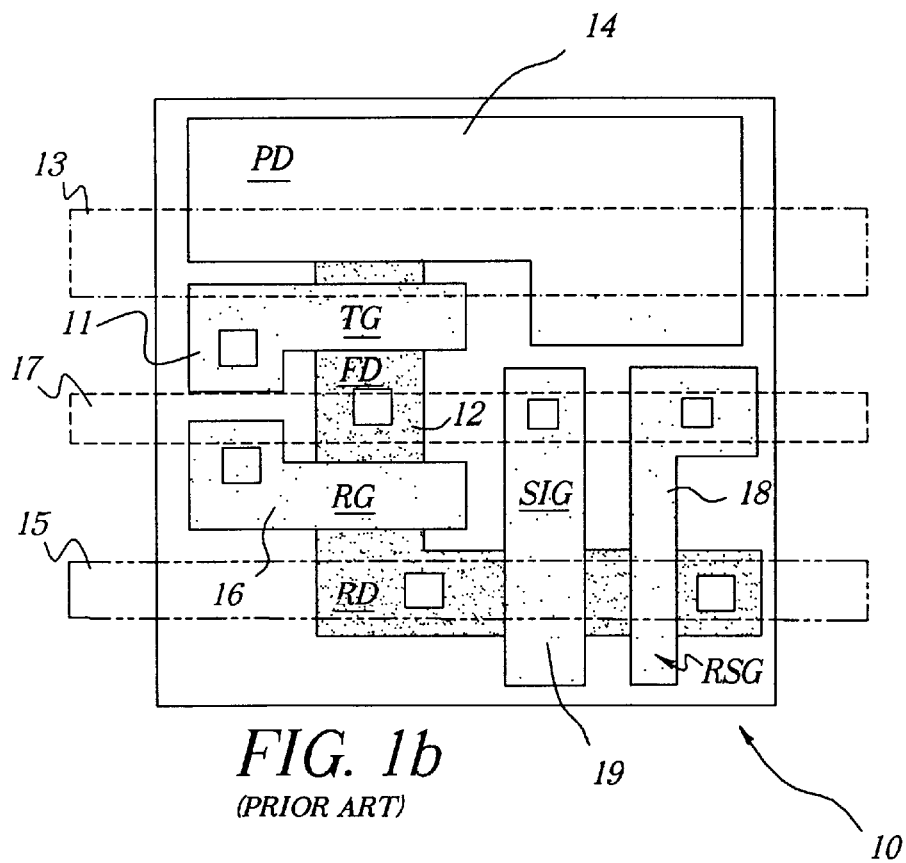

We have discovered that row signal lines can be combined resulting in greater fill factor for Active Pixel Sensors (APS) which are typically CMOS based image sensors. This addresses shortcomings present in the prior art pixel 10 illustrated in FIG. 1a, which is a schematic drawing of a typical APS prior art pixel design. The first part of the present invention can be described conceptually as follows: in order to provide correlated double sampling to suppress read noise and offset noise, the floating diffusion 12 must be reset prior to the photodetector 14 signal charge being transferred onto the floating diffusion 12. The prior art accomplishes this operation by providing a separate signal to reset gate 16 immediately prior to the sample and hold of the reset level. If the reset is done not immediately prior to, but at some reasonable time before a sample and hold of the reset signal, the same results can be obtained. The time interval between the signal being applied to the reset gate 16, and the sample and hold taken of the reset level, must just be short enough so that dark current does not appreciably diminish the saturation signal headroom, (i.e. produce a fat zero). Additionally, each row will have its own row select gate 18 which is part of a source follower transistor configuration with SIGNAL transistor 19. The prior art device of FIG. 1a employs separate reset gate busses 15, transfer gate busses 13 and row select busses 17 within each row of the Active Pixel Sensor. FIG. 1b shows a typical layout of the prior art pixel illustrated schematically in FIG. 1a such that it is evident that transfer gate bus 13, row select gate buss 17 and reset gate bus 15 consume a great deal of space within pixel 10.

Figure 2:
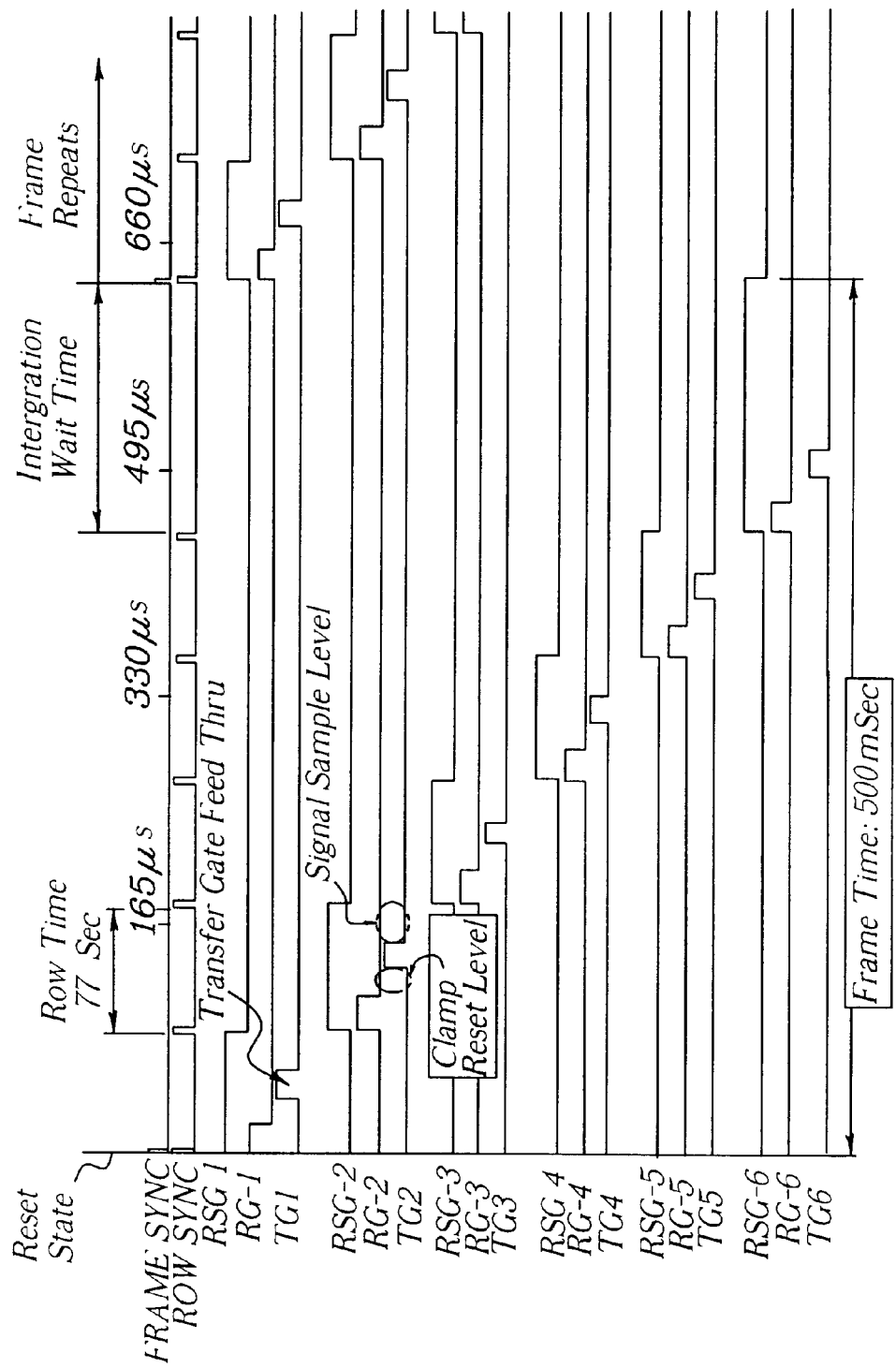
FIG. 2 is a timing diagram for the pixel shown in FIG. 1a and 1b.

The row timing signals for a sensor using the pixel in FIG. 1 are shown in FIG. 2. This shows the operation of a 6 row image sensor. The entire image sensor starts off in a reset state, all transfer gates 11 on and all reset gates 16 on. Each row starts integrating sequentially by turning off its respective reset gate 16 and transfer gate 11 off in succession. After row 1 has integrated for the desired time, the row select signal for row 1 goes high, the floating diffusion 12 for each pixel 10 within row 1 is reset by turning reset gate 16 on, the reset level is sampled and held, the signal charge is then transferred to the floating diffusion 12 by turning transfer gate 11 on, and then the signal level is sampled and held. The row select signal for row 1 then goes low, followed by the row select signal for row 2 going high. The same reset gate 16 and transfer gate 11 timing is then done for row 2. This is repeated for the remaining rows of the sensor, 6 in this case. It is evident that each row contains a separate metal buss for each of the row timing signals, row select gate 18, reset gate 16 and transfer gate 11.

Figure 3:
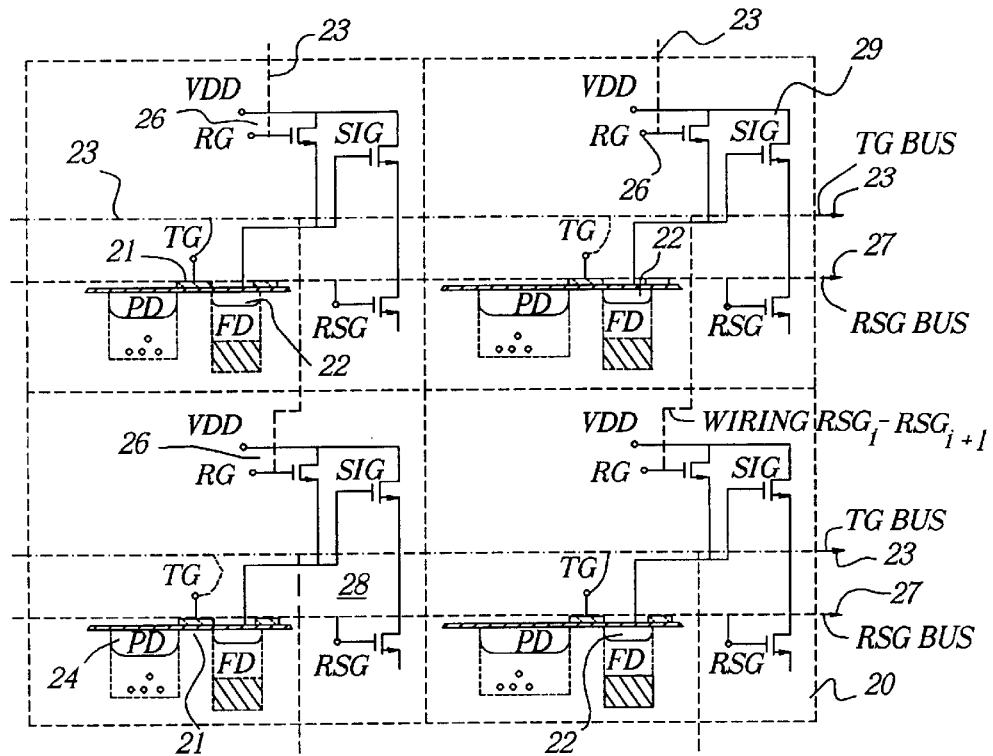
FIG. 3 is a schematic drawing of a preferred embodiment of the present invention.

The concept of the present invention envisions that signal lines within a sensor can be reduced by sharing specific types of signal lines between rows. Referring to FIG. 3. Each pixel 20 will integrate for the desired time, the row select signal 27 for a selected row goes high, the floating diffusion 22 for each pixel 20 within the selected row 1 reset by turning reset gate 26 on, the reset level is sampled and held, the signal charge is then transferred to the floating diffusion 22 by turning transfer gate 21 on, and then the signal level is sampled and held. The row select signal for the selected row then goes low, followed by the row select signal for the next row to be read going high. The same reset gate 26 and transfer gate 21 timing is then done for this next selected row. This is repeated for each of the rows. It is evident that each rows contains a separate buss for the reset buss 27. However, the row timing buss 27 is shared with the transfer gate buss 23 in an adjacent row.

Figure 4:
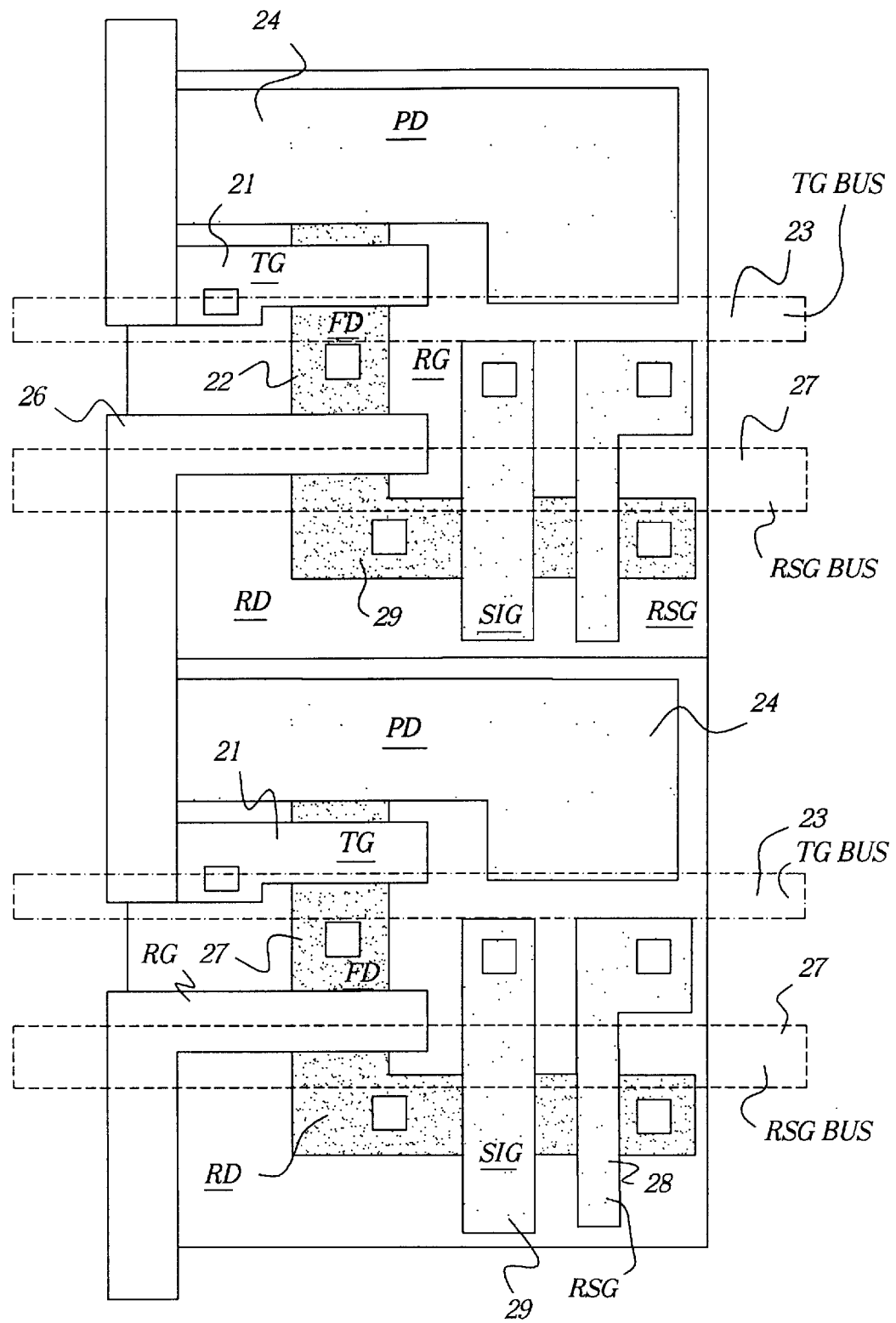
FIG. 4 is a top view illustrating the layout of an embodiment of the present invention.
Figure 5:
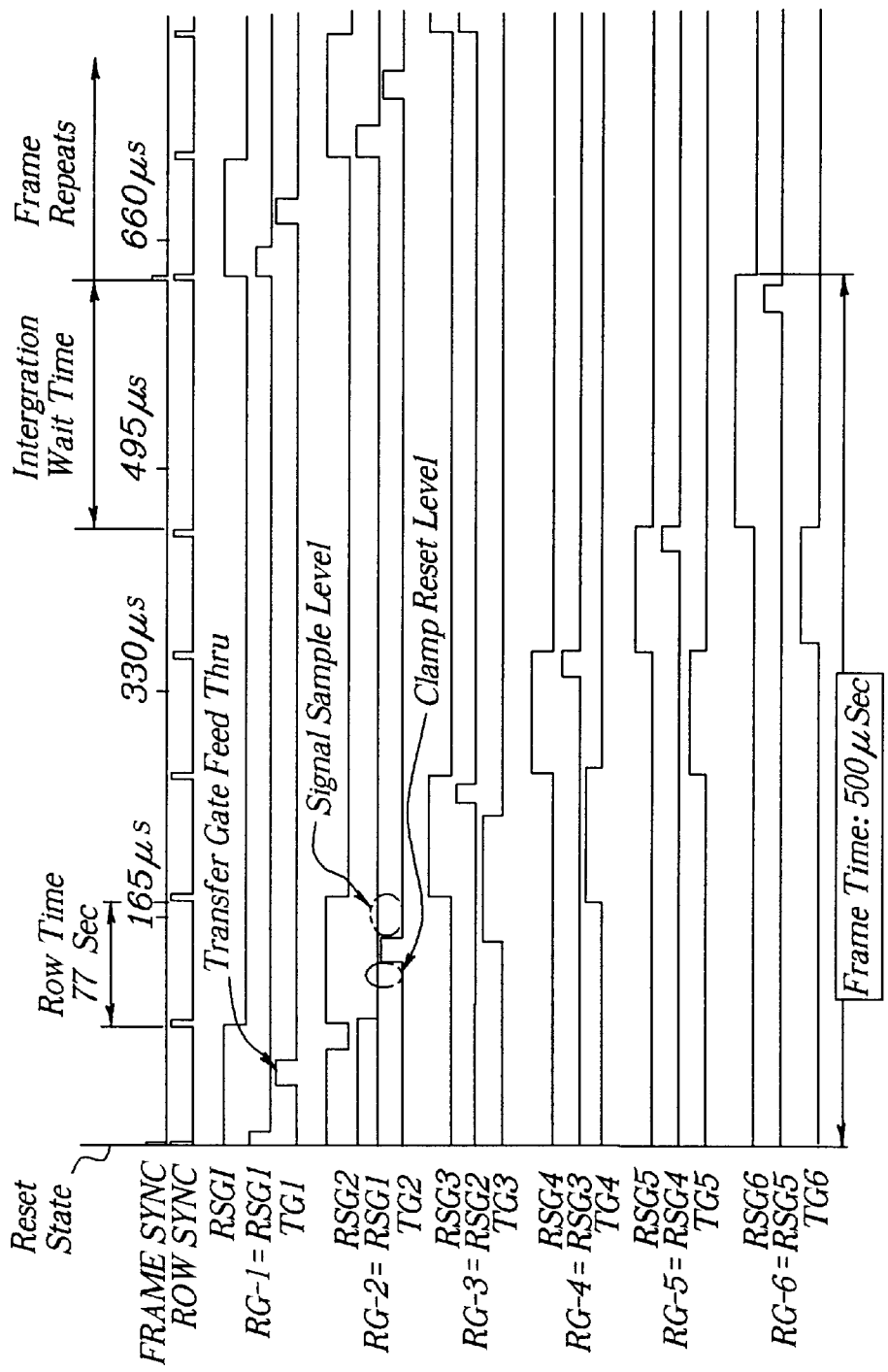
FIG. 5 is a timing diagram for one method of the present invention.

There are two optimum ways to accomplish this, which are presented as preferred embodiments. The following two examples of the present invention are given in the order of decreasing time interval between the resetting of the floating diffusion 22 and sample and hold of the reset level. Referring to FIG. 3, the transfer gate bus 23 of a row that has been previously read is employed as the reset gate bus for the row that is currently being read. This method is employed to reduce the total number of signal lines uses a timing signal of the previous row within the readout scheme of the current row. In the first example, the transfer gate 21 of row n is used as the reset gate 26 of row n+1, where n is the row currently being read out. FIG. 4 illustrates a top view of one possible layout of this first method in reducing the signal bus lines showing two adjacent pixels in different rows. The reset gates 26 of the second row are seen as electrically being connected to the transfer gate bus 23 of the first row.

Figure 6:
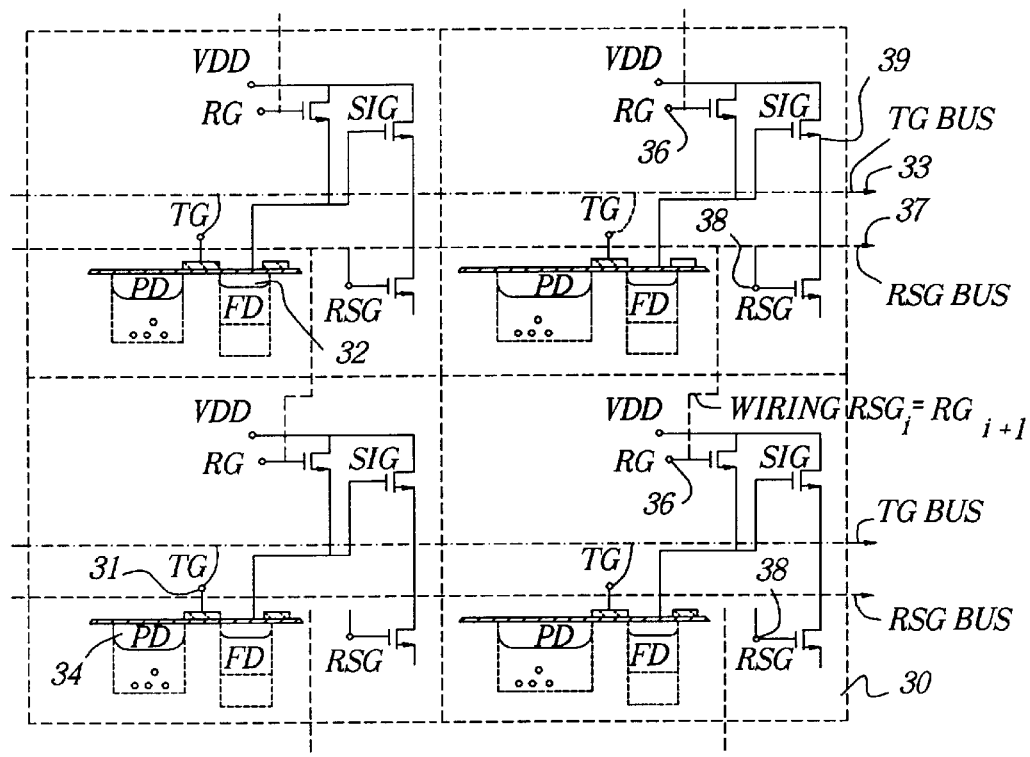
FIG. 6 is a schematic drawing of another preferred embodiment of the present invention.

A second example is illustrated in FIG. 6, wherein the row select gate buss 37 of row n is used as the reset gate buss 36 of row n+1. This bus architecture reduces the number of busses per row from 3 to 2 and accordingly, reduces the area that is occluded from the photodetector 34 resulting in an increase in the fill factor of the pixel. Additionally, the routing from a buss or an active component within a pixel in a given row, to the reset gate of the next row is a short distance and can be done in polysilicon, providing an effective extra level of interconnect that also produces a higher fill factor.

Figure 7:
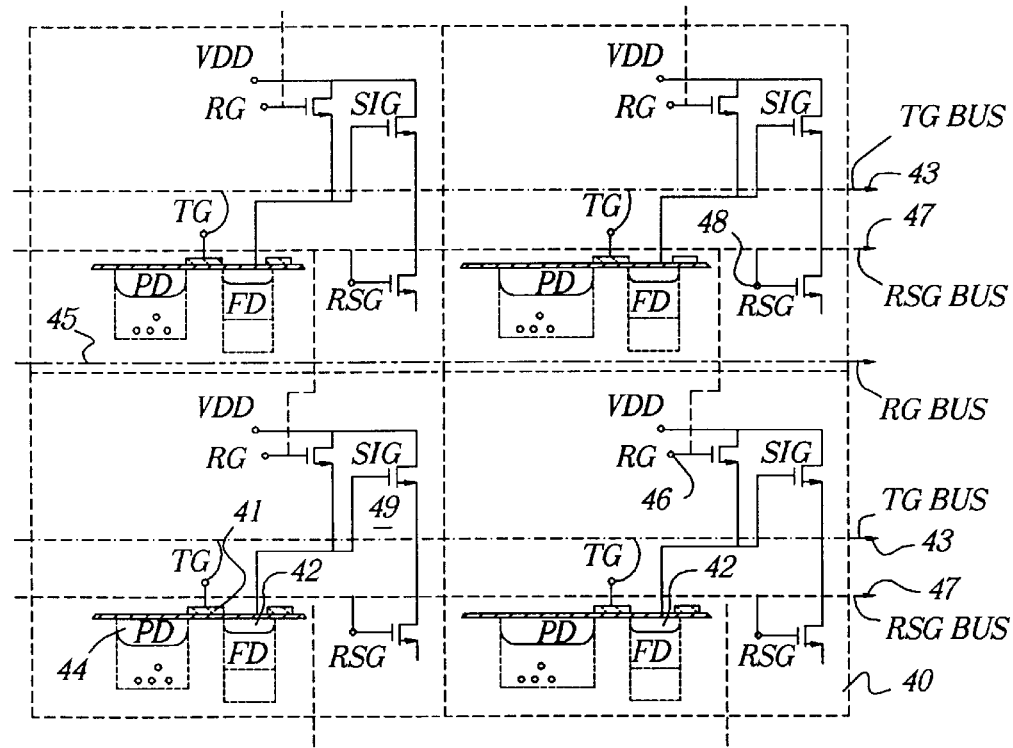
FIG. 7 is a schematic drawing of another preferred embodiment of the present invention.
Figure 8:
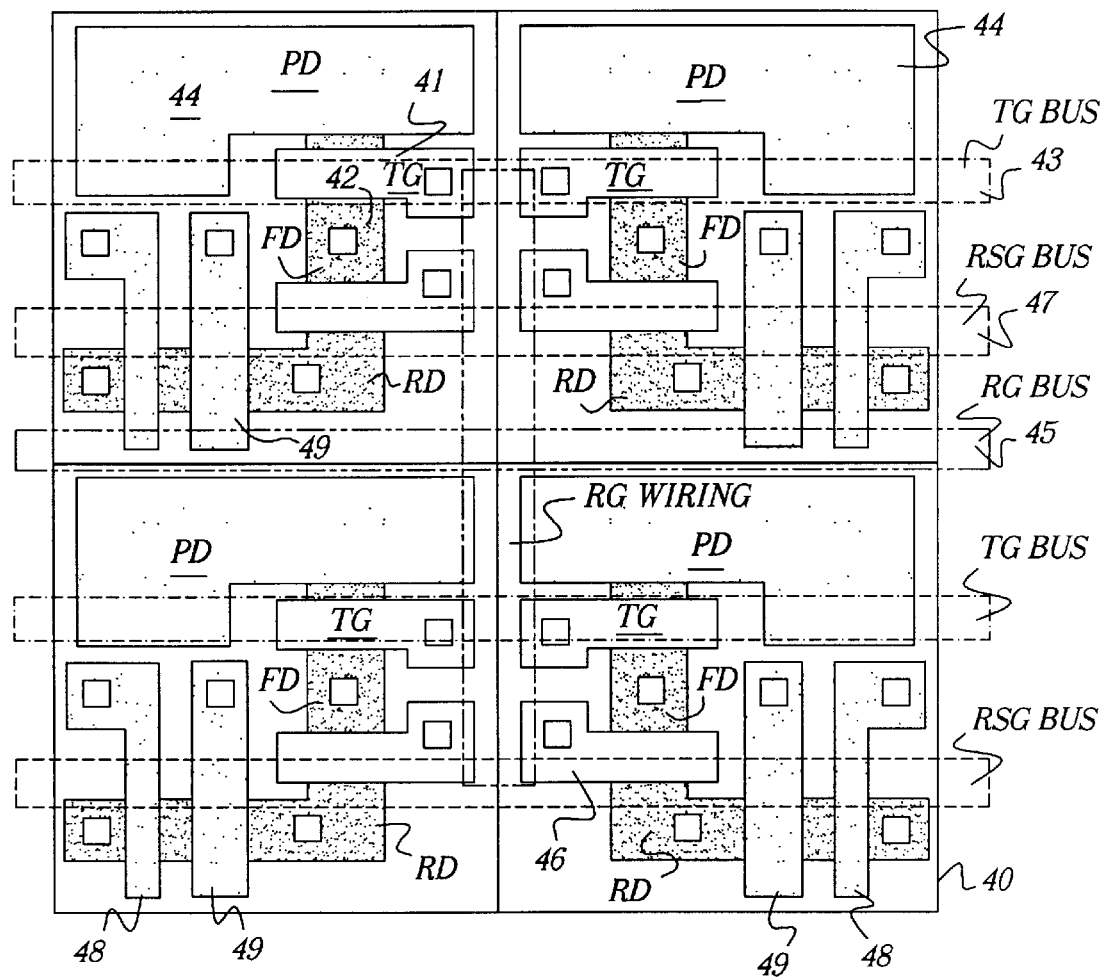
FIG. 8 is a top view illustrating the layout of the preferred embodiment shown in FIG. 7.

Another example, shown schematically in FIG. 7, and in top view layout in FIG. 8, is that number of signal lines can be reduced by sharing reset gate busses 45. This provides an effective means of reducing the number of contact regions and busses because it utilizes the fact that it is possible continually reset every floating diffusion when resetting any one row, does not affect the operation of the device. Hence the reset gate buss 45 of any one row can be shared with any other row or rows. Furthermore, more rigorously, the reset gate 46 for any one pixel or set of pixels can share the signal that is applied to the reset gate 46 with any other pixel or set of pixels. This also reduces the number of busses and contact regions per row, and increases the fill factor of the pixels. The remaining structure is similar to that shown in the previous embodiments with photodetector 44 creating electrons pairs from incident light storing these electrons as a signal charge until transfer gate 41 transfers the stored charge to floating diffusion 42 which acts as a sense node input to signal transistor 49.

Figure 10:
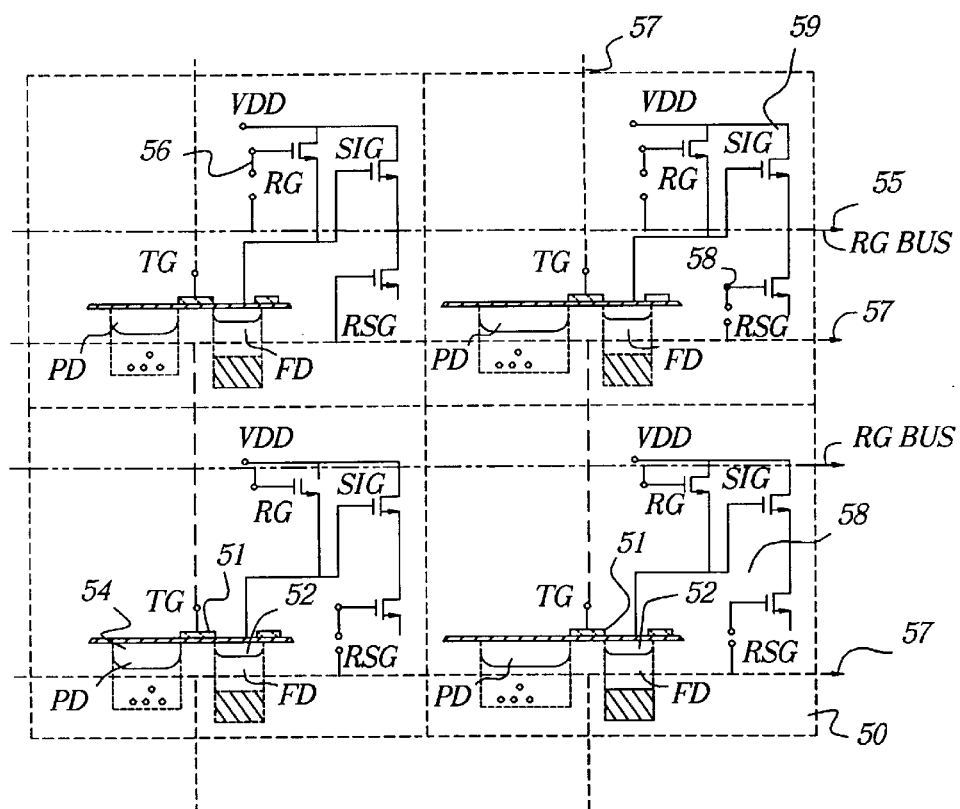
FIG. 10 is a schematic drawing of another embodiment of the present invention.
Figure 9:
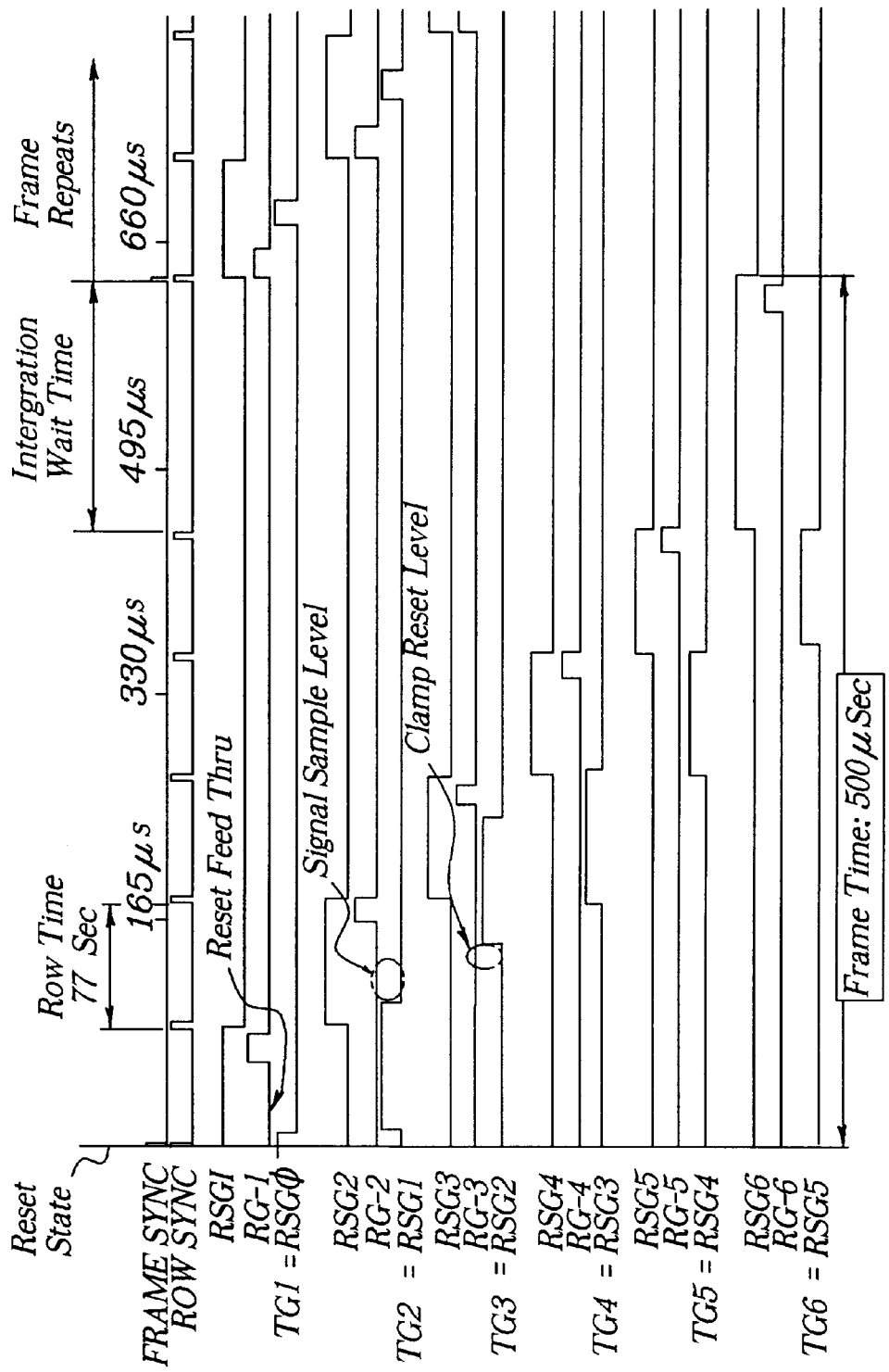
FIG. 9 is a timing diagram for the embodiment of the present invention as shown in FIG. 10.

Another means of reducing the number of busses and contact regions is shown in FIG. 10 where the row select gates 58 are of one row on the same signal buss as the transfer gates 51 in the next row to be read out. This approach reverses the order of operation between transfer gates 51 and reset gates 52. The photodetector signal level is transferred and sampled and held prior to the reset of floating diffusion 52 and the sample and hold of the reset level. In this manner, pixel offset cancellation is accomplished, but correlated double sampling (CDS) cannot be done. As a result there will be higher temporal noise. This also reduces the number of busses per row from 3 to 2. The timing diagram is shown in FIG. 9.

It should be noted and understood that the specific examples disclosed and provided are 1 set of specific embodiments used for illustration of this invention. Other specific physical embodiments are possible.

PARTS LIST 10 pixel
11 transfer gate
12 floating diffusion
13 transfer gate buss
14 photodetector
15 reset gate buss
16 reset gate
17 row select gate buss
18 row select gate
19 signal transistor
20 pixel
21 transfer gate
22 floating diffusion
23 transfer gate buss
24 photodetector
26 reset gate
27 row select gate buss
28 row select gate
29 signal transistor 30 pixel
31 transfer gate
32 floating diffusion
33 transfer gate buss
34 photodetector
36 reset gate
37 row select gate buss
38 row select gate
39 signal transistor
40 pixel
41 transfer gate
42 floating diffusion
43 transfer gate buss
44 photodetector
45 reset gate buss
46 reset gate
47 row select gate buss
48 row select gate
50 pixel
51 transfer gate
52 floating diffusion
54 photodetector
55 reset gate buss
56 reset gate
57 row select gate buss
58 row select gate
59 signal transistor

What is claimed is:

1. An active pixel sensor comprising:
   a CMOS substrate having a plurality of pixels formed in a plurality of rows and columns;
   wherein each of the pixels further comprises a photodetector having active circuitry elements associated with the photodetector;
   at least two control busses associated with each row of pixels; and
   wherein one of the control busses for a given row functions as one of the control busses for a different row, and wherein the at least two control busses further comprise a row select buss and a reset buss.

2. The active pixel sensor of claim 1 wherein the row select buss for a row currently being read functions as the reset gate buss for the next row.

3. An active pixel sensor comprising:
   a CMOS substrate having a plurality of pixels formed in a plurality of rows and columns;
   wherein each of the pixels further comprises a photodetector having active circuitry elements associated with the photodetector;
   at least two control busses associated with each row of pixels; and
   wherein one of the control busses for a given row functions as one of the control busses for a different row; and wherein the control buss that functions as the control buss for another row is a reset buss for each of the rows.

4. An active pixel sensor comprising:
   a CMOS substrate having a plurality of pixels formed in a plurality of rows and columns;
   wherein each of the pixels further comprises a photodetector having active circuitry elements associated with the photodetector;
   at least two control busses associated with each row of pixels; and
   wherein one of the control busses for a given row functions as one of the control busses for a different row;
   and wherein the at least two control busses further comprise a row select buss and a transfer gate buss.

5. The active pixel sensor of claim 4 wherein row select buss for a row currently being read functions as the transfer gate buss for the next row to be read.

6. An active pixel sensor comprising:
   a CMOS substrate having a plurality of pixels formed in a plurality of rows and columns;
   wherein each of the pixels further comprises a photodetector having active circuitry elements associated with the photodetector;
   at least two control busses associated with each row of pixels; and
   wherein one of the control busses for a given row functions as one of the control busses for a different row; and wherein the at least two control busses further comprise a transfer gate buss and a rest gate buss.

7. The active pixel sensor of claim 6 wherein the transfer gate buss for a row currently being read functions as the reset gate buss for the next row to be read.

8. An active pixel sensor comprising:
   a CMOS substrate having a plurality of pixels formed in a plurality of rows and columns;
   wherein each of the pixels further comprises a photodetector having active circuitry elements associated with the photodetector;
   at least two control busses associated with each row of pixels; and
   wherein one of the control busses for a given row functions as one of the control busses for a different row; and wherein the active circuitry elements further comprises a source follower amplifier that is operatively connected to the photodetector.

9. An active pixel sensor comprising:
   a semiconductor substrate having a plurality of pixels formed in a plurality of rows and columns wherein each of the pixels has at least one active circuit element associated with the pixel and each pixel has a photodetector that can generate electrons from incident light;
   means for reading the row of pixels out in a sequential order;
   at least two signal busses associated with each row of pixels such that each of the signal busses controls a different function in the pixel; and
   a buss structure that connects one of the signal busses of a first row in the sequential order to one of the signal busses to a second row in the sequential order, wherein the second row is read after the first in the sequential order, and wherein the at least two signal busses are both reset gate busses.

10. An active pixel sensor comprising:
    a semiconductor substrate having a plurality of pixels formed in a plurality of rows and columns wherein each of the pixels has at least one active circuit element associated with the pixel and each pixel has a photodetector that can generate electrons from incident light;
    means for reading the row of pixels out in a sequential order;
    at least two signal busses associated with each row of pixels such that each of the signal busses controls a different function in the pixel; and
    a buss structure that connects one of the signal busses of a first row in the sequential order to one of the signal busses to a second row in the sequential order, wherein the second row is read after the first in the sequential order, wherein the at least two signal busses further comprise a row select buss and a reset buss and wherein the row select buss for a row currently being read functions as the reset gate buss for the next row to be read.

11. An active pixel sensor comprising:

a semiconductor substrate having a plurality of pixels formed in a plurality of rows and columns wherein each of the pixels has at least one active circuit element associated with the pixel and each pixel has a photodetector that can generate electrons from incident light;

means for reading the row of pixels out in a sequential order;

at least two signal busses associated with each row of pixels such that each of the signal busses controls a different function in the pixel; and a buss structure that connects one of the signal busses of a first row in the sequential order to one of the signal busses to a second row in the sequential order, wherein the second row is read after the first in the sequential order, and wherein the at least two signal busses further comprise a transfer gate buss and a row select buss and wherein the row select buss for a row currently being read functions as the transfer gate buss for the next row to be read.

12. An active pixel sensor comprising:

a semiconductor substrate having a plurality of pixels formed in a plurality of rows and columns wherein each of the pixels has at least one active circuit element associated with the pixel and each pixel has a photodetector that can generate electrons from incident light;

means for reading the row of pixels out in a sequential order;

at least two signal busses associated with each row of pixels such that each of the signal busses controls a different function in the pixel; and a buss structure that connects one of the signal busses of a first row in the sequential order to one of the signal busses to a second row in the sequential order, wherein the second row is read after the first in the sequential order, and wherein the at least two signal busses further comprise a transfer gate buss and a reset buss and wherein the transfer gate buss for a row currently being read functions as the reset gate buss for the next row to be read.

13. An active pixel sensor comprising:

a semiconductor substrate having a plurality of pixels formed in a plurality of rows and columns;

wherein each of the pixels has a photodetector element, a transfer gate having a first side adjacent to the photodetector element, a charge sensing area adjacent a second side of the transfer gate that is opposite the first side and at least one active circuit element associated with the pixel and coupled to the charge sensing area;

means for reading the row of pixels out in a sequential order;

at least two signal busses associated with each row of pixels; and a buss structure that connects one of the signal busses in a first row currently being read with one of the signal busses associated with a second row that will be read next.

14. The active pixel sensor of claim 13 where the at least two signal busses are both reset gate busses.

15. The active pixel sensor of claim 13 where the at least two signal busses further comprise a row select buss and a reset gate buss.

16. The active pixel sensor of claim 15 wherein the row select buss for a row currently being read functions as the reset gate buss for the next row to be read.

17. The active pixel sensor of claim 15 wherein the at least two signal busses further comprise a row select buss and a transfer gate buss, and the row select buss for a row currently being read functions as the transfer gate buss for the next row to be read.

18. The active pixel sensor of claim 15 wherein the at least two signal busses further comprise a transfer gate buss and a reset gate buss, and the transfer gate select buss for a row currently being read functions as the reset gate buss for the next row to be read.

* * * * *